United States Patent
Henrici

(10) Patent No.: US 9,960,462 B2
(45) Date of Patent: May 1, 2018

(54) METHOD FOR MONITORING A BATTERY

(71) Applicant: ROBERT BOSCH GMBH, Stuttgart (DE)

(72) Inventor: Fabian Henrici, Stuttgart (DE)

(73) Assignee: ROBERT BOSCH GMBH, Stuttgart (DE)

(*) Notice: Subject to any disclaimer, the term of this patent is extended or adjusted under 35 U.S.C. 154(b) by 114 days.

(21) Appl. No.: 14/357,820

(22) PCT Filed: Sep. 27, 2012

(86) PCT No.: PCT/EP2012/069063
§ 371 (c)(1),
(2) Date: May 13, 2014

(87) PCT Pub. No.: WO2013/072117
PCT Pub. Date: May 23, 2013

(65) Prior Publication Data
US 2014/0368209 A1    Dec. 18, 2014

(30) Foreign Application Priority Data

Nov. 18, 2011 (DE) .................. 10 2011 086 616
Jun. 19, 2012 (DE) .................. 10 2012 210 253

(51) Int. Cl.
*H02J 7/00* (2006.01)
*H01M 10/48* (2006.01)
(Continued)

(52) U.S. Cl.
CPC .......... *H01M 10/486* (2013.01); *G01K 13/00* (2013.01); *G01K 15/00* (2013.01); *G01R 31/362* (2013.01); *H01M 2/202* (2013.01); *H01M 10/0431* (2013.01); *H01M 10/425* (2013.01); *H01M 10/4207* (2013.01); *H01M 10/4235* (2013.01); *H01M 10/4257* (2013.01);
(Continued)

(58) Field of Classification Search
CPC ...... H02J 7/0021; H02J 7/042; G01R 31/362; G01R 31/3658
USPC ................................. 320/107, 108; 324/434
See application file for complete search history.

(56) References Cited

U.S. PATENT DOCUMENTS 6,133,709 A * 10/2000 Puchianu .............. B60L 3/0046
                                                       320/116
7,774,141 B2 * 8/2010 Li .......................... G01N 33/24
                                                         702/11
(Continued)

FOREIGN PATENT DOCUMENTS

CN     1284033 A     2/2001
CN     1319189 A     10/2001
(Continued)

OTHER PUBLICATIONS

International Search Report for PCT/EP2012/069063, dated Jan. 21, 2013.

*Primary Examiner* — Nathaniel Pelton
(74) *Attorney, Agent, or Firm* — Norton Rose Fulbright US LLP; Gerard Messina

(57) ABSTRACT

In a method for monitoring a battery which includes a number of cells, in each instance, at least one electronic unit is situated so as to be in contact with at least two of the cells, in order to record a variable of this cell and forward it to a central receiver.

13 Claims, 1 Drawing Sheet

(51) Int. Cl.
- *H01M 2/20* (2006.01)
- *H01M 10/42* (2006.01)
- *G01R 31/36* (2006.01)
- *G01K 13/00* (2006.01)
- *G01K 15/00* (2006.01)
- *H01M 10/04* (2006.01)

(52) U.S. Cl.
CPC ...... *H01M 10/482* (2013.01); *G01K 2205/00* (2013.01); *G01R 31/3658* (2013.01); *H01M 2010/4271* (2013.01); *H01M 2010/4278* (2013.01); *H01M 2200/10* (2013.01); *H01M 2220/20* (2013.01)

(56) References Cited

U.S. PATENT DOCUMENTS

| | | | |
|---|---|---|---|
| 7,808,375 B2* | 10/2010 | Bertness | B60Q 1/50 340/455 |
| 8,410,756 B2* | 4/2013 | Sakakibara | H01M 2/1022 320/107 |
| 8,872,474 B2* | 10/2014 | Scheucher | B60K 1/04 320/107 |
| 2002/0102457 A1 | 8/2002 | Oogami et al. | |
| 2006/0087286 A1 | 4/2006 | Phillips et al. | |
| 2006/0091891 A1 | 5/2006 | Woo et al. | |
| 2008/0282018 A1* | 11/2008 | Nakanishi | H01M 10/482 710/316 |
| 2009/0261779 A1* | 10/2009 | Zyren | G06Q 50/06 320/109 |
| 2011/0009824 A1* | 1/2011 | Yodfat | A61M 5/14248 604/151 |
| 2011/0273023 A1* | 11/2011 | Nishida | H01M 10/425 307/77 |
| 2012/0306442 A1* | 12/2012 | Raghavan | H02J 7/00 320/109 |

FOREIGN PATENT DOCUMENTS

| | | |
|---|---|---|
| CN | 102025500 A | 4/2011 |
| DE | 199 28 446 | 12/2000 |
| EP | 0 926 796 | 6/1999 |
| EP | 2 295 282 | 3/2011 |
| WO | WO 2007/104325 | 9/2007 |
| WO | WO 2009/035611 | 3/2009 |
| WO | WO 2009/149690 | 12/2009 |

* cited by examiner

METHOD FOR MONITORING A BATTERY

BACKGROUND OF THE INVENTION

1. Field of the Invention

The present invention relates to a method for monitoring a battery and a battery that is configured to carry out the method.

2. Description of the Related Art

An interconnection of several galvanic cells, which are, as a rule, substantially identical, is referred to as a battery. It constitutes an electrochemical energy store and an energy converter and is provided for supplying electrical energy. When discharging occurs in the battery, stored chemical energy is converted to electrical energy by the electrochemical reaction. The cells of the battery, which may be connected in parallel or in series or a mixture of the two, are arranged in so-called modules. One or more of these modules, connected in series or parallel, form the battery.

In the case of the above-mentioned cells, primary cells, which are not rechargeable, are distinguished from secondary cells, which are rechargeable. A rechargeable battery is also referred to as an accumulator having accumulator cells. In the following, both a non-rechargeable and a rechargeable battery are to be understood as a battery.

In motor vehicles, a so-called starter battery, which is configured, e.g., as a lead-acid battery, is used, on one hand, for providing the electric current for the starting motor of the internal combustion engine. In addition to powering the starting motor, the battery also powers the other electrical load circuits in the vehicle. To start the internal combustion engine, high currents are required for a short period of time, the high currents also having to be provided at low temperatures.

On the other hand, in motor vehicles, in so-called electric vehicles and hybrid vehicles, batteries are used as power sources for propelling the vehicle. These are also referred to as traction batteries.

It is always necessary to monitor the operability of the battery in the vehicle regularly or even continuously, in order to ensure reliable operation of the motor vehicle. To this end, parameters or operating variables of the battery, such as terminal voltage, temperature, pressure, in particular, the internal cell pressure, current, impedance, etc., are recorded.

It must be taken into consideration that in the construction of accumulator modules for hybrid and electric vehicles, up to 100 or more individual cells are interconnected and packed together. In this context, up to now, only the voltage of each cell has been measured. However, further parameters, such as the temperature, are only measured in a small portion of the cells of an accumulator module. Ideally, at least the temperature of each cell should be individually measured during operation. However, this would mean a very high expenditure for wiring.

A battery including battery cells, and a method for monitoring the battery, are known from the printed publication published international patent application document WO 2009/149690 A1. In this context, the battery has a multitude of battery cell stacks connected in series; a battery cell stack being able to include a single battery cell or to be made up of battery cells connected in parallel. Sensors monitor the state of charge of individual battery cells. The battery described is assigned a charge-balancing device (cell balancing), which includes a target value table of the permissible state of charge of individual battery cells. The charge-balancing device varies the charging state as a function of the state of charge. When the target value for the state of charge of individual battery cells is reached, the charge balancing of the battery cells is interrupted. A tap of a charge-balancing lead is situated at each battery cell; the charge-balancing leads being united in a wiring harness and supplied to designated cell-monitoring modules, which have, for their part, sensors and cell-monitoring circuits; these components of the cell monitoring being positioned together in the charge-balancing device, spatially separated from the battery cells.

BRIEF SUMMARY OF THE INVENTION

Thus, the method set forth is used for recording variables, such as measured variables or parameters or physical variables, e.g., in accumulator modules, for, in particular, measuring cell temperature in accumulator modules of hybrid or electric vehicles. Consequently, the measurement of individual variables, such as the cell temperatures, in a module including many cells and not having individual wiring, is rendered possible. This reduces costs and therefore allows the temperature of individual cells to be measured, which has not been done up to now for reasons of cost.

In this context, in each instance, at least one electronic unit is in contact with at least two of the cells, in order to record a variable. This means that in an embodiment, an electronic unit is positioned so as to be in contact with each of the cells. Alternatively, it may be provided that in each module of the battery, an electronic unit be positioned so as to be in contact with, in each instance, one cell. Then, the number of modules corresponds to the number of electronic units. In one embodiment, each of the modules may be assigned at least one electronic unit. Positioned so as to be in contact with a cell means that the electronic unit is situated in or on, normally directly on, the associated cell.

The electronic units record, in each instance, at least one variable of the cell to which they are assigned. This may mean that each electronic unit records solely one variable of the assigned cell. Thus, each of the recorded variables gives solely a piece of information regarding the state of the corresponding cell.

In one particular variant, an electronic unit, e.g., a microchip, in particular, a CMOS chip, having, in particular, a thermal oscillator, is positioned in or on or at each cell for measuring the variable, in particular, measuring a temperature. In an embodiment, these are only connected to the terminals (poles) of the cell, in order to supply themselves with energy. The frequency of the oscillator is a function of, in particular, the temperature. Thus, the oscillator converts the temperature to a proportional frequency. When the temperature in all of the cells is equal, all of the oscillators oscillate at the same frequency.

By coupling in the temperature-dependent frequency or a voltage-dependent frequency (capable of being switched over or switched in) or a fixed frequency, with modulation of the measured temperature and/or voltage value upon the supply lines, the measured variables are transmitted to the central control unit. In order to distinguish the different electronic units, the frequency dependent on the measured value may be linked with, or modulated so as to have, a unique designation or ID. This ID may be made up of, e.g., the serial number of the cell or also of the corresponding unit, or made up of an 8-bit word burned in upon the final measurement. In the control unit, the measuring signals are separated again and evaluated, using, e.g., Fourier analysis.

The temperature information is transmitted, e.g., by inductive or capacitive coupling of this oscillation by each electronic unit onto the common power supply. A central receiver (microchip), which is connected to the same power supply as the electronic units and is in communication with it, e.g., via current bars of the battery pack, extracts the oscillations again, evaluates them, and forwards the measured values to the control unit, e.g., via a standard sensor interface. Alternatively, this receiver may also be situated or integrated directly in the control unit, e.g., in the battery.

In one embodiment, the evaluation is carried out, using A/D conversion with subsequent Fourier analysis. Since all of the oscillations would overlap and an assignment would be impossible, each electronic unit is provided with a separate ID, e.g., an 8-bit word burned in upon the final measurement. This ID is modulated upon the oscillation frequency by the electronic unit. In this manner, a beat is produced at a low frequency, which is a function of both the ID and the temperature-dependent carrier frequency. This allows a unique assignment of a measured value to an electronic unit. Only the frequency has to be determined, the amplitude does not have any effect. In this manner, the method is highly immune to interference.

In an alternative variant, the evaluation is carried out by modulating the measured sensor values upon a fixed frequency and demodulating this information in the receiver. The fixed frequency may be set either using a quartz reference in the electronic unit, or by timing recovery from a frequency signal transmitted by the receiver, e.g., in the control unit, to the electronic unit; this advantageously takes place, in particular, in a bidirectional communication.

As an alternative, or in addition, the individual electronic units may also be supplied with energy by an integrated power supply or an integrated energy harvester and then do not have to have any terminals at all. The signal transmission then takes place, e.g., by radio. Energy harvesting is understood to mean the recovery of small amounts of electrical energy from sources such as ambient temperature, vibration, etc.

Alternatively, or in addition to, measuring temperature, other parameters or measured variables, such as internal cell pressure, the cell voltage, the cell current, the cell impedance, etc., may also be measured and modulated upon the oscillation.

The present invention has, in at least some variants, considerable advantages:

Individual measurement of each cell temperature in a battery pack, which may include 100 or more, is rendered possible without requiring additional wiring. This results in considerable cost savings.

The thermal oscillators are subject to a very low production variance. Therefore, no calibration is necessary. On the assembly line, only different ID's have to be burned in, and only electrically, without controlled temperature and without measurement. This also results in considerable cost savings.

Since no complicated transmission protocol is used, but only an oscillation is coupled in, the electronic unit is small and inexpensive.

No feed-through leads through the cell are necessary for the connection of the electronic unit. This results in cost savings and increased reliability.

The method set forth and the measuring set-up shown may be used, in principle, for all applications, in which parameters, such as temperature, must be measured during operation and individual wiring would result in high costs. Use in batteries of electric vehicles is particularly advantageous.

If the electronic unit only measures the temperature, then the measurement of the cell voltages may continue to take place in the module control unit. If the electronic unit also carries out a measurement of cell voltage, the control units in the modules may be omitted, and only one control unit per battery must be installed.

A further optional function of the electronic unit may include the so-called cell balancing. In this context, a specific discharging current of the battery cell is extracted via a transistor and resistor integrated in the electronic unit. This may be initiated via a bidirectional communication from the control unit, or by the electronic unit itself. Then, no bidirectional communication is required.

The electronic units may have a standby mode, in which the power consumption is reduced, and they may be shifted into this state either via a bidirectional communication from the control unit, or they recognize the operating states of the motor vehicle independently from the interference present on the current conductor due to the engine and/or the inverter.

Any measured variables (voltage, temperature, current, pressure, ... ) may either be converted to a frequency and transmitted to the control unit by coupling them onto the current bars or supply lines (several variables via alternating transmission), or they may be additionally modulated upon an oscillation as a digital value, together with the ID of the electronic unit.

The optional bidirectional communication may take place similarly to the communication of the electronic unit with the control unit, by modulating the frequency emitted by the electronic unit with a command and sending it back to the electronic unit. In principle, the communication may take place bidirectionally or unidirectionally. In principle, the current bars provided in a battery may be used as communication paths. Accordingly, these are used both for supplying power and as communication paths.

Additional advantages and embodiments of the present invention are derived from the description and the appended figures.

It will be appreciated that the features mentioned above and the features yet to be described below may be used not only in the combination given in each case, but also in other combinations or individually, without departing from the scope of the present invention.

DETAILED DESCRIPTION OF THE INVENTION

Figure 1:
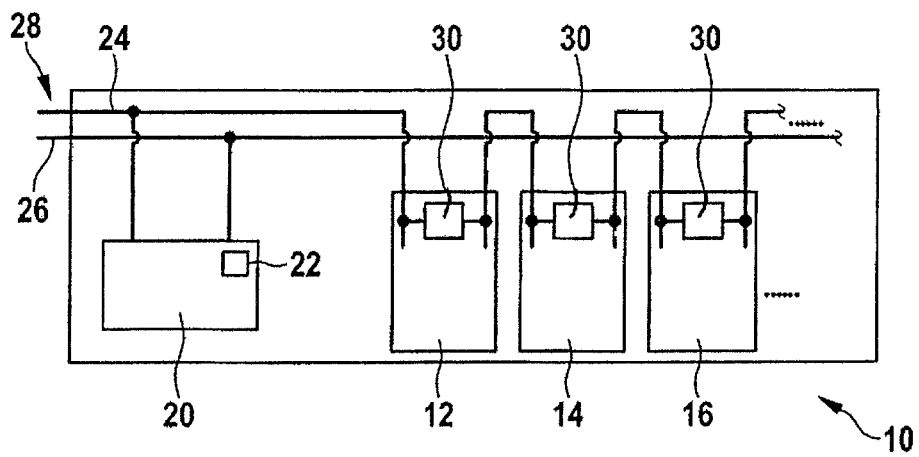
FIG. 1 shows a variant of the described battery.

The present invention is represented schematically in the drawing in light of specific embodiments, and is described in detail below with reference to the drawing.

A schematic representation of a variant of a battery, which is denoted, on the whole, by the reference numeral 10, is illustrated in FIG. 1. A number of cells, of which only a first cell 12, a second cell 14 and a third cell 16 are shown for the sake of clarity, are situated in this battery. In addition, a control unit 20 is provided in the battery; a central receiver 22 being positioned, in turn, in the control unit.

In order to make available the electrical energy converted by cells 12, 14 and 16, current bars 24 and 26 are provided as supply lines, which supply the electrical energy at a terminal 28 of battery 10. To this end, current bars 24 and 26 are each connected to cells 12, 14 and 16. In addition, control unit 20 is connected to cells 12, 14 and 16 via current bars 24 and 26, so that control unit 20 may measure the total battery voltage and is optionally supplied with electrical energy.

Furthermore, in each instance, an electronic unit 30 is situated in each of cells 12, 14 and 16; the electronic unit taking the form of, e.g., a sensor and being used for recording at least one variable or parameter of the assigned cell 12, 14, and 16. These electronic units 30, which may each be implemented, e.g., in an ASIC, are also powered via current bars 24 and 26 and transmit the recorded parameter or measured variable, i.e., the recorded variables, to central receiver 22 in control unit 20 via current bars 24 and 26. The variables may be transmitted at a carrier frequency. In this context, the variables may be transmitted by inductive coupling of oscillations, which are supplied by electronic units 30.

In the illustrated variant, central receiver 22 is implemented in control unit 20. As an alternative, central receiver 22 may also be situated outside of the control unit and be assigned to it or also to a plurality of control units. In addition, in the variant shown, electronic units 30 are connected to current bars 24, 26, in order to power the same and to pass along the recorded data. Alternatively, each electronic unit 30 may also have its own power supply. In this case, the recorded data may also be transmitted wirelessly, e.g., by radio, to central receiver 22. In any case, the at least one electronic unit 30 is in communication with the central receiver.

Furthermore, it should be noted that in the variant shown in FIG. 1, electronic units 30 are situated in assigned cells 12, 14 and 16, respectively. Alternatively, it may be provided that electronic units 30 be situated on or at assigned cell 12, 14 and 16. In any case, electronic unit 30 is in contact with assigned cell 12, 14 or 16. In one variant, in the case of some cells 12, 14, and 16, the assigned electronic units may be situated in the assigned cell 12, 14, and 16, and in the case of other cells 12, 14, and 16, the assigned electronic units may be situated on these cells 12, 14, and 16. The selection of the arrangement may also be made as a function of the parameters to be recorded.

In the specific embodiment shown in FIG. 1, cells 12, 14 and 16 are positioned in series. In an alternative variant, cells 12, 14 and 16 are positioned in parallel.

Figure 2:
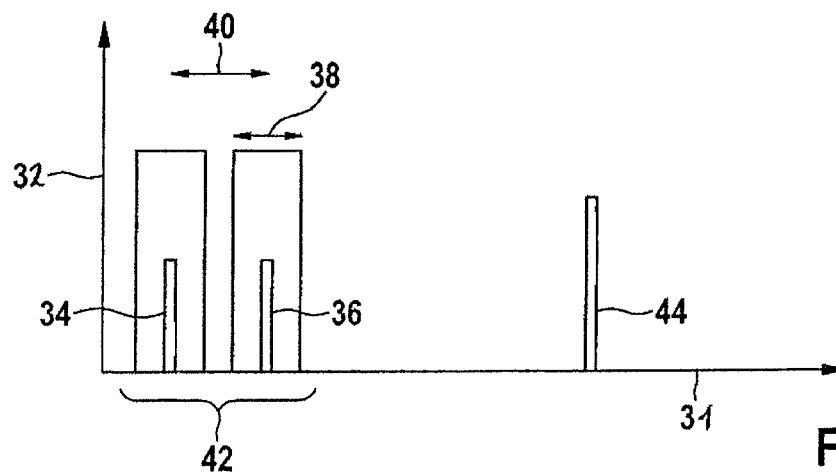
FIG. 2 shows, in a graph, a variant of the described transmission method.

A graph of a possible transmission method is represented in FIG. 2. In the graph, the frequency is plotted on an abscissa 31 and the amplitude is plotted on an ordinate 32, in Fourier analysis. A first bar 34 is assigned to a first electronic unit, and a second bar 36 is assigned to a second electronic unit. A first double arrow 38 shows the variation by temperature, and therefore, the temperature dependence of the signals provided by the electronic units. A second double arrow 40 shows the variation by different ID of the electronic units. This shows that the two bars 34 and 36 do not overlap in the entire temperature range, and that therefore, an unequivocal assignment of the bar, and therefore the frequency information, to the corresponding electronic unit is possible.

A brace 42 clearly shows the beat from the ID and carrier frequency. A third bar 44 shows the spectrum of the oscillation, which is a function of the temperature and the carrier frequency. In this context, it should be noted that when all of the cells are at the same temperature, all of the signals of the electronic units overlap. This may be filtered out by a low-pass filter in the central receiver.

Figure 3:
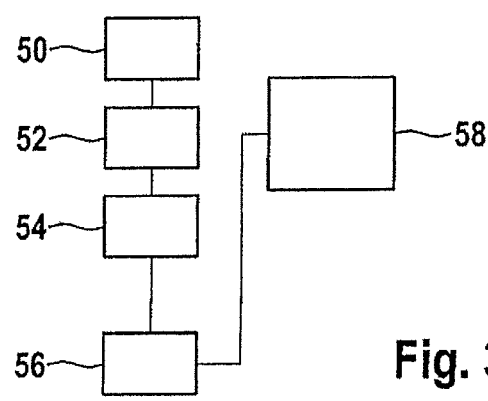
FIG. 3 shows a schematic of a battery pack having a distributed control system.

FIG. 3 illustrates a schematic representation of a layout of a battery pack having a distributed control system. The representation shows a first control unit 50, a second control unit 52, a third control unit 54 and a fourth control unit 56. Control units 50, 52, 54 and 56 are interconnected. Each of these control units 50, 52, 54 and 56 is assigned to a module, which contains, for example, several cells. All of the modules together form the battery.

In addition, the representation shows a central control unit 58, which is connected to fourth control unit 56. In this manner, central control unit 58 receives information or data from all control units 50, 52, 54 and 56. This set-up constitutes a so-called distributed system or a daisy chain.

In an alternative variant, central control unit 58 may also be directly connected to all control units 50, 52, 54 and 56.

What is claimed is:

1. A method for monitoring a battery of a motor vehicle which includes multiple cells, comprising:
   providing at least two electronic units;
   contacting each of the at least two electronic units with at least two of the multiple cells such that each cell is in contact with at least two of the electronic units, wherein each of the electronic unit is situated in or on a respective multiple cell of at least two of the multiple cells that it is contacting, wherein each cell of the multiple cells has a single electronic unit situated in or on the respective cell; and
   recording and transmitting, by at least one of the electronic units, at least one variable of at least one of the cells to a central receiver,
   wherein the electronic unit includes an oscillator situated in or on each cell for recording at least one of a temperature and a cell voltage as the at least one variable,
   wherein a frequency of the oscillator is a function of the at least one variable,
   wherein the at least one variables is transmitted to a central control unit, and
   wherein, to distinguish the at least two electronic units, the oscillation frequency is at least one of linked with or modulated to have a unique identification.

2. The method as recited in claim 1, wherein the at least one variable is transmitted at a carrier frequency.

3. The method as recited in claim 1, wherein the least one variable is transmitted by inductive coupling of oscillations supplied by the electronic units.

4. The method as recited in claim 3, wherein the at least one recorded variable is linked to an identifier and subsequently forwarded to the central receiver.

5. The method as recited in claim 4, wherein the at least one variable forwarded to the central receiver is evaluated using Fourier analysis.

6. The method as recited in claim 4, wherein current bars of the battery are used for forwarding the at least one variable.

7. A battery monitoring system for a battery of a motor vehicle having multiple cells, comprising:
   at least two electronic units, wherein each of the at least two electronic units contacts at least two of the multiple cells such that each cell is in contact with at least two of the electronic units, wherein each of the electronic unit is situated in or on a respective multiple cell of at least two of the multiple cells that it is contacting, wherein each cell of the multiple cells has a single electronic unit situated in or on the respective cell;

wherein the electronic units are configured to record and transmit at least one variable of at least one of the cells to a central receiver, wherein the electronic unit includes an oscillator situated in or on each cell for recording at least one of a temperature and a cell voltage as the at least one variable, wherein a frequency of the oscillator is a function of the at least one variable, wherein the at least one variables is transmitted to a central control unit, and wherein, to distinguish the at least two electronic units, the oscillation frequency is at least one of linked with or modulated to have a unique identification.

8. The system as recited in claim 7, wherein in each instance, at least one electronic unit is situated inside of at least two of the cells.

9. The battery as recited in claim 7, wherein the central receiver is implemented in a control unit of the battery.

10. The battery as recited in claim 9, wherein the at least two electronic units are connected to the central receiver via current bars of the cells of the battery.

11. The battery as recited in claim 9, wherein each of the at least two electronic units has a dedicated power supply.

12. The battery as recited in claim 9, wherein at least one of the electronic units is configured to carry out charge balancing.

13. The battery as recited in claim 9, wherein the electronic units include a microchip having a thermal oscillator.

* * * * *